(12) United States Patent
Yonezawa et al.

(10) Patent No.: US 11,775,187 B2
(45) Date of Patent: Oct. 3, 2023

(54) MEMORY SYSTEM AND DATA MANAGEMENT METHOD INCLUDING BLOCK ALLOCATION MANAGEMENT

(71) Applicant: KIOXIA CORPORATION, Tokyo (JP)

(72) Inventors: Shinji Yonezawa, Tokyo (JP); Tomoyuki Kantani, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 86 days.

(21) Appl. No.: 17/465,501

(22) Filed: Sep. 2, 2021

(65) Prior Publication Data
US 2022/0308772 A1    Sep. 29, 2022

(30) Foreign Application Priority Data

Mar. 23, 2021    (JP) .................. 2021-048688

(51) Int. Cl.
*G06F 12/00*   (2006.01)
*G06F 3/06*    (2006.01)
(Continued)

(52) U.S. Cl.
CPC .......... *G06F 3/0631* (2013.01); *G06F 3/0604* (2013.01); *G06F 3/064* (2013.01);
(Continued)

(58) Field of Classification Search
CPC ...... G06F 3/0631; G06F 3/0604; G06F 3/064; G06F 3/0659; G06F 3/0679; G06F 3/061; G06F 3/0658; G06F 3/0688; G11C 16/0483; G11C 16/08; G11C 16/10; G11C 16/26; G11C 11/5628; G11C 11/5642; G11C 2211/5622; G11C 5/025
(Continued)

(56) References Cited

U.S. PATENT DOCUMENTS 7,818,490 B2 * 10/2010 Conley ............... G06F 12/0246
                                                          711/115
10,811,075 B1   10/2020 Cheng
(Continued)

FOREIGN PATENT DOCUMENTS

JP        3827640 B2 *  9/2006 ......... G06F 12/0246
JP     2014134998 A     7/2014
(Continued)

*Primary Examiner* — Mardochee Chery
(74) *Attorney, Agent, or Firm* — Kim & Stewart LLP

(57) ABSTRACT

According to one embodiment, a memory system includes first and second memory chips. The first memory chip has a first plane with a first block and a second block and a second plane with a third block and a fourth block. The second memory chip has a third plane with a fifth block and a sixth block and a fourth plane with a seventh block and an eighth block. The memory controller sets the first and third blocks as a first block unit in a user data storage area and the fifth and seventh blocks as a second block unit in the user data storage area. The memory controller allocates the second block, the fourth block, the sixth block, and the eighth block to a management data storage area. The memory controller manages user data operations for accessing the user data storage area in block units.

20 Claims, 7 Drawing Sheets

(51) Int. Cl.
G11C 16/26 (2006.01)
G11C 16/04 (2006.01)
G11C 16/10 (2006.01)
G11C 16/08 (2006.01)

(52) U.S. Cl.
CPC .......... *G06F 3/0659* (2013.01); *G06F 3/0679* (2013.01); *G11C 16/0483* (2013.01); *G11C 16/08* (2013.01); *G11C 16/10* (2013.01); *G11C 16/26* (2013.01)

(58) Field of Classification Search
USPC .......................................................... 711/103
See application file for complete search history.

(56) References Cited

U.S. PATENT DOCUMENTS

| | | |
|---|---|---|
| 2007/0288686 A1 | 12/2007 | Arcedera |
| 2010/0228928 A1 | 9/2010 | Asnaashari |
| 2012/0215964 A1* | 8/2012 | Kaneko ............... G06F 12/0246 |
| | | 711/E12.008 |
| 2014/0032992 A1* | 1/2014 | Hara ................... G06F 11/1072 |
| | | 714/773 |
| 2015/0036430 A1 | 2/2015 | Sukegawa |
| 2019/0196723 A1 | 6/2019 | Yano et al. |
| 2019/0347193 A1* | 11/2019 | Jang ....................... G11C 16/16 |
| 2019/0362081 A1 | 11/2019 | Kanno |
| 2019/0371220 A1 | 12/2019 | Zhou |
| 2020/0379898 A1 | 12/2020 | Yang |
| 2021/0064113 A1 | 3/2021 | Laurent |

FOREIGN PATENT DOCUMENTS

| | | | |
|---|---|---|---|
| JP | 2021522579 A | * | 1/2021 |
| TW | 200807241 A | | 2/2008 |
| TW | 201040971 A | | 11/2010 |
| TW | 201506951 A | | 2/2015 |
| TW | 202004502 A | | 1/2020 |
| TW | 202006553 A | | 2/2020 |
| TW | 202032547 A | | 9/2020 |
| TW | 202034172 A | | 9/2020 |
| TW | 202044264 A | | 12/2020 |
| TW | 202109515 A | | 3/2021 |
| TW | 202109537 A | | 3/2021 |

* cited by examiner

FIG. 5

| MANAGEMENT ID | CH | CP | BLOCK UNIT | |
|---|---|---|---|---|
| | | | PLN0 | PLN1 |
| 0001 | 0 | 0 | BLK0_0 | BLK0_1 |
| 0002 | 0 | 0 | BLK1_0 | BLK1_1 |
| 0003 | 0 | 1 | BLK0_0 | BLK0_1 |
| 0004 | 0 | 1 | BLK1_0 | BLK1_1 |
| 0005 | 0 | 2 | BLK1_0 | BLK0_1 |
| 0006 | 0 | 2 | BLK2_0 | BLK1_1 |
| ⋮ | ⋮ | ⋮ | ⋮ | ⋮ |
| 0031 | 3 | 15 | BLK0_0 | BLK0_1 |
| 0032 | 3 | 15 | BLK1_0 | BLK1_1 |

FIG. 6

| MANAGEMENT ID | CH | CP | PLN | BLK |
|---|---|---|---|---|
| 1001 | 0 | 0 | 0 | BLK2_0 |
| 1002 | 0 | 0 | 1 | BLK2_1 |
| 1003 | 0 | 0 | 0 | BLK3_0 |
| 1004 | 0 | 0 | 1 | BLK3_1 ← BAD BLOCK |
| 1005 | 0 | 1 | 0 | BLK2_0 |
| 1006 | 0 | 1 | 1 | BLK2_1 |
| 1007 | 0 | 1 | 0 | BLK3_0 |
| 1008 | 0 | 1 | 1 | BLK3_1 |
| 1009 | 0 | 2 | 0 | BLK0_0 ← BAD BLOCK |
| 1010 | 0 | 2 | 1 | BLK2_1 |
| 1011 | 0 | 2 | 0 | BLK3_0 ← BAD BLOCK |
| 1012 | 0 | 2 | 1 | BLK3_1 |
| ⋮ | ⋮ | ⋮ | ⋮ | ⋮ |
| 1061 | 3 | 15 | 0 | BLK2_0 |
| 1062 | 3 | 15 | 1 | BLK2_1 |
| 1063 | 3 | 15 | 0 | BLK3_0 ← BAD BLOCK |
| 1064 | 3 | 15 | 1 | BLK3_1 |

MEMORY SYSTEM AND DATA MANAGEMENT METHOD INCLUDING BLOCK ALLOCATION MANAGEMENT

CROSS-REFERENCE TO RELATED APPLICATION

This application is based upon and claims the benefit of priority from Japanese Patent Application No. 2021-048688, filed Mar. 23, 2021, the entire contents of which are incorporated herein by reference.

FIELD

An embodiment described herein relates generally to a memory system and a data management method.

BACKGROUND

A memory system using a solid-state drive (SSD) equipped with a nonvolatile semiconductor memory, such as NAND flash memory, is known.

BRIEF DESCRIPTION OF THE DRAWINGS

FIG. 5 is a user data table according to an embodiment.

FIG. 6 is a management data table according to an embodiment.

DETAILED DESCRIPTION

An embodiment provides a memory system and a data management method that can improve processing capability.

In general, according to one embodiment, a memory system includes at least a first memory chip and second memory chip. The first memory chip has a first plane with a first block and a second block and a second plane with a third block and a fourth block. The second memory chip has a third plane with a fifth block and a sixth block and a fourth plane with a seventh block and an eighth block. The memory controller sets the first and third blocks as a first block unit in a user data storage area and the fifth and seventh blocks as a second block unit in the user data storage area. The memory controller allocates the second block, the fourth block, the sixth block, and the eighth block to a management data storage area. The memory controller manages user data operations for accessing the user data storage area in the block units that have been set.

One or more example embodiments are described below with reference to drawings. The drawings are schematic. In the following description, components having substantially the same functions and configurations are denoted by the same reference symbol. The number after a character in a reference symbol can used to distinguish elements having similar constitution.

1. Configuration

1.1 Configuration of Memory System

Figure 1:
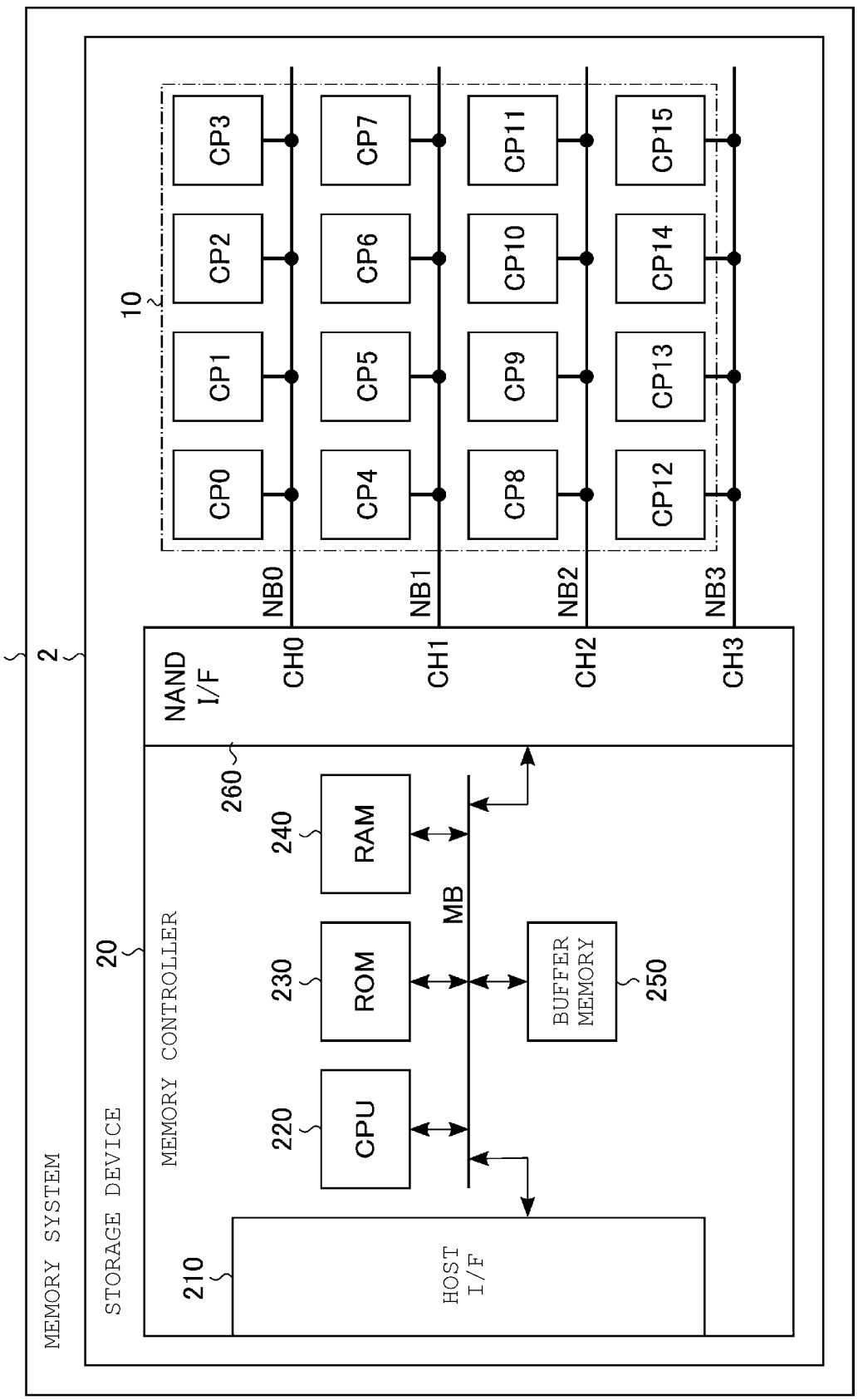
FIG. 1 is a block diagram illustrating a memory system according to an embodiment.

First, an example of the overall configuration of a memory system 1 is described with reference to FIG. 1.

The memory system 1 includes at least one storage device 2. The storage device 2 is, for example, a solid-state drive (SSD). The storage device 2 is connected to a host device. The host device is an information processing device that controls the memory system 1. The storage device 2 includes a nonvolatile memory 10 and a memory controller 20.

The memory controller 20 is, for example, system-on-a-chip (SoC). The memory controller 20 controls the nonvolatile memory 10 based on a request (instruction) from the host device. The memory controller 20 commands the nonvolatile memory 10 to read, write, or erase data. Each function of the memory controller 20 may be implemented by a dedicated circuit, or may be implemented by a processor executing firmware or the like.

Next, the internal configuration of the nonvolatile memory 10 is described. The nonvolatile memory 10 includes a plurality of memory chips CP. The number of memory chips CP in the nonvolatile memory 10 can be freely selected. In FIG. 1, the nonvolatile memory 10 includes 16 memory chips CP0 to CP15.

Each memory chip CP is, for example, a NAND flash memory. The memory chip CP can store the data in a nonvolatile manner. The memory chips CP can operate independently of each other. Each memory chip CP is connected to the memory controller 20 via a NAND bus NB. The number of NAND buses NB and the number of memory chips CP connected to each NAND bus NB can be freely selected. In FIG. 1, the memory chips CP0, CP1, CP2, and CP3 are connected to the memory controller 20 via a NAND bus NB0. The memory chips CP4, CP5, CP6, and CP7 are connected to the memory controller 20 via a NAND bus NB1. The memory chips CP8, CP9, CP10, and CP11 are connected to the memory controller 20 via a NAND bus NB2. The memory chips CP12, CP13, CP14, and CP15 are connected to the memory controller 20 via a NAND bus NB3.

Next, the internal configuration of the memory controller 20 is described. The memory controller 20 includes a host interface circuit 210, a processor 220 (e.g., a CPU; central processing unit), a read only memory (ROM) 230, a built-in memory 240 (e.g., RAM: Random Access Memory), a buffer memory 250, and a NAND interface circuit 260. A memory bus MB is provided in the memory controller 20. The host interface circuit 210, the processor 220, the ROM 230, the built-in memory 240, the buffer memory 250, and the NAND interface circuit 260 are connected to the memory bus MB.

The host interface circuit 210 is a hardware interface for performing communication with the host device. For example, the host interface circuit 210 transfers an instruction received from the host device to the processor 220. The host interface circuit 210 transfers data received from the host device to the buffer memory 250. The data received from the host device is referred to as "user data". The host interface circuit 210 transfers the data or the like in the buffer memory 250 to the host device based on the instruction of the processor 220.

The processor 220 is a control circuit of the memory controller 20. The processor 220 controls the operation of the whole memory controller 20. More specifically, the processor 220 controls the host interface circuit 210, the ROM 230, the built-in memory 240, the buffer memory 250, and the NAND interface circuit 260. For example, when the processor 220 receives a write request from the host device, the processor 220 issues a write command based on the write request. The processor 220 transmits the write command to the NAND interface circuit 260. The same applies when the processor 220 receives a read request from the host device. The processor 220 manages a memory space of the nonvolatile memory 10.

The ROM 230 is a read-only semiconductor memory. Firmware (a control program) or the like is stored in the ROM 230. The firmware is executed by the processor 220.

The built-in memory 240 is, for example, a semiconductor memory such as dynamic random access memory (DRAM). For example, firmware read from the ROM 230 is loaded in the built-in memory 240. The built-in memory 240 is also used as a working area of the processor 220.

The built-in memory 240 includes a cache area. The cache area is, for example, an area where management data is temporarily stored. The management data is information related to the storage device 2. The information related to the storage device 2 includes, for example, various control programs, information about the memory chips CP, various setting parameters, and various tables. The various tables include a user data table and a management data table. The user data table is used for managing user data. The management data table is used for managing the management data. For example, the user data table and the management data table are read from the nonvolatile memory 10 then loaded on the built-in memory 240 as management data when the power is turned on (device initialization, startup or the like). When the user data table and the management data table in the built-in memory 240 are updated, for example, the user data table and the management data table are transmitted to the nonvolatile memory 10 as management data.

The buffer memory 250 is a volatile semiconductor memory. The buffer memory 250 temporarily stores read data, write data, and the like. The read data is the data read from the nonvolatile memory 10. The write data is the data to be written to the nonvolatile memory 10.

The NAND interface circuit 260 is a hardware interface for communication between the memory controller 20 and the nonvolatile memory 10. In an example of FIG. 1, the NAND interface circuit 260 has four channels CH0, CH1, CH2, and CH3. The four NAND buses NB0, NB1, NB2, and NB3 are connected to the channels CH0, CH1, CH2, and CH3, respectively. For example, the NAND interface circuit 260 receives an instruction for the nonvolatile memory 10 from the processor 220. The NAND interface circuit 260 selects one or more channels CH based on the instruction. During a write operation, the NAND interface circuit 260 transfers the control signals, the command, the address, and the write data for the write operation to the nonvolatile memory 10 via the selected channels CH. During a read operation, the NAND interface circuit 260 transmits the control signals, the command, and the address for the read operation to the nonvolatile memory 10 via the selected channels CH. The NAND interface circuit 260 transfers the read data to the buffer memory 250.

1.2 Internal Configuration of Memory Chip

Figure 2:
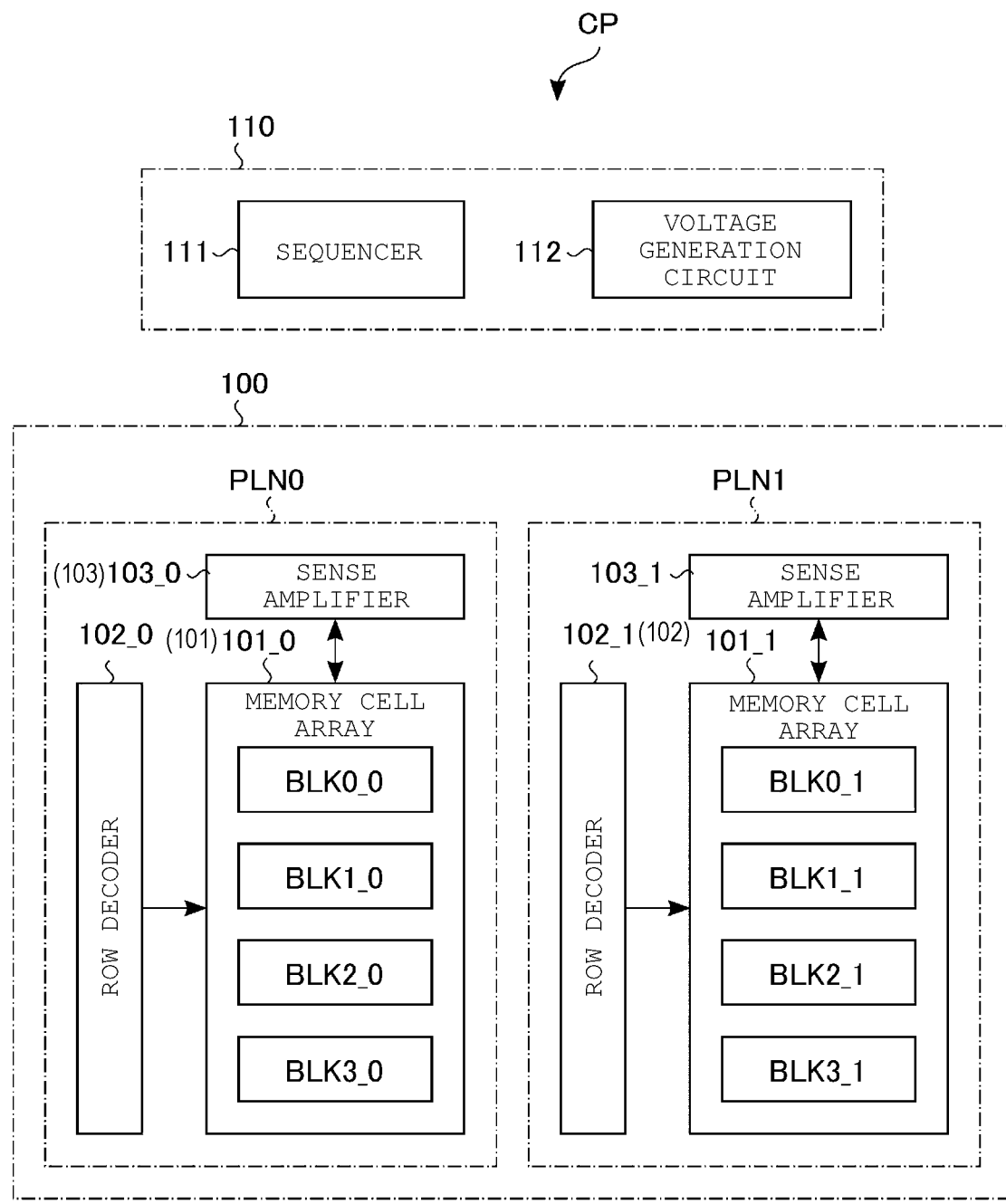
FIG. 2 is a block diagram illustrating a memory chip according to an embodiment.

Next, an example of the internal configuration of the memory chip CP is described with reference to FIG. 2. FIG. 2 is a block diagram illustrating the basic configuration of the memory chip CP. In the example illustrated in FIG. 2, a part of the connection of each block is indicated by arrows. However, the connections between each block is not limited thereto.

The memory chip CP includes a memory core unit 100 and a peripheral circuit unit 110.

The memory core unit 100 is a central unit of operation in the memory chip CP.

The peripheral circuit unit 110 is a circuit unit provided on the periphery of the memory core unit 100.

Next, the internal configuration of the memory core unit 100 is described. The memory core unit 100 includes, for example, two planes PLN0 and PLN1. The number of the planes PLN is not limited to two. The number of the planes PLN may be one or three or more. Each plane PLN is a unit on which a data write operation and a data read operation can be performed. The planes PLN0 and PLN1 can operate independently of each other. The planes PLN0 and PLN1 can also be operated in parallel. When user data is written in the memory chip CP, the write operations of all the planes PLN in the memory chip CP are executed in parallel. Also, when management data is written in the memory chip CP, the write operation of one of the planes PLN may be performed, and the write operations of the plurality of planes PLN may be performed in parallel.

The internal configuration of the plane PLN is described below. The following describes when the planes PLN0 and PLN1 are of the same configuration. In other examples, the configuration of each plane PLN may be different. Each plane PLN includes a memory cell array 101, a row decoder 102, and a sense amplifier 103. In the description below, when limited to the plane PLN0, the designations a memory cell array 101_0, a row decoder 102_0, and a sense amplifier 103_0 are used. When limited to the plane PLN1, the designations a memory cell array 101_1, a row decoder 102_1, and a sense amplifier 103_1 are used.

Each memory cell array 101 is a set of arranged memory cell transistors. Each memory cell array 101 includes, for example, four blocks BLK (BLK0, BLK1, BLK2, and BLK3). The number of blocks BLK in the memory cell array 101 can be freely selected. Each block BLK is, for example, a set of memory cell transistors in which data can be collectively erased. That is, the block BLK is an erase unit.

The memory cell array 101 of the present embodiment includes a user area and a system area as a space area of memory. The user area is an area where user data is stored. The system area is an area in which management data is stored. The system area is an area that the host device cannot access. In the present embodiment, each block BLK is allocated to either the user area or the system area. The allocation of the user area and the system area is described later.

In the following description, the blocks BLK0, BLK1, BLK2, and BLK3 are referred to as blocks BLK0_0, BLK1_0, BLK2_0, and BLK3_0, respectively, when limited to the plane PLN0. When limited to the plane PLN1, the blocks BLK0, BLK1, BLK2, and BLK3 are referred to as blocks BLK0_1, BLK1_1, BLK2_1, and BLK3_1, respectively.

Each row decoder 102 is a decode circuit for a row address. The row address is address information received from the memory controller 20. The row decoder 102 selects a block BLK in the memory cell array 101 based on a decoding result. The row decoder 102 applies a voltage to wiring (e.g., a word line and a select gate line) in the row direction of the selected block BLK.

The sense amplifier 103 is a read and write circuit. The sense amplifier 103 reads data from the memory cell array 101 during a read operation. During a write operation, the sense amplifier 103 applies a voltage corresponding to the write data to the memory cell array 101.

Next, the internal configuration of the peripheral circuit unit 110 is described. The peripheral circuit unit 110 includes a sequencer 111 and a voltage generation circuit 112.

The sequencer 111 is a control circuit of the memory chip CP. The sequencer 111 controls the operation of the whole memory chip CP. More specifically, the sequencer 111 controls the voltage generation circuit 112, and the row decoder 102, the sense amplifier 103 or the like of each plane PLN during a write operation, a read operation, and an erase operation.

The voltage generation circuit 112 generates voltages used for a write operation, a read operation, and an erase operation. The voltage generation circuit 112 supplies a voltage to the row decoder 102 and the sense amplifier 103 or the like.

1.3 Circuit Configuration of Memory Cell Array

Figure 3:
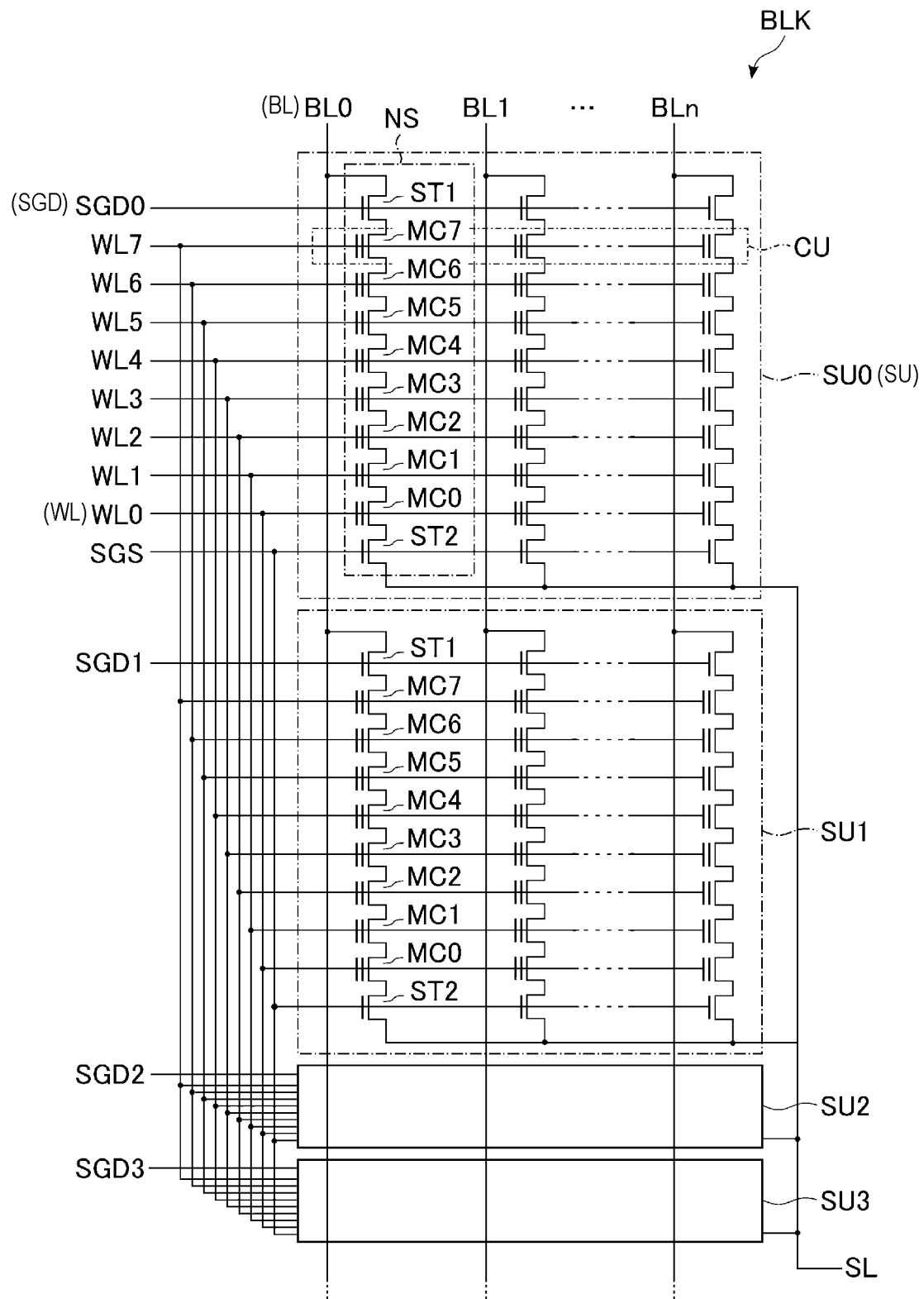
FIG. 3 is a circuit diagram illustrating a memory cell array according to an embodiment.

Next, an example of the circuit configuration of the memory cell array 101 is described with reference to FIG. 3. The example in FIG. 3 illustrates the circuit configuration of one block BLK.

The block BLK includes, for example, four string units SU0 to SU3. The number of the string units SU in the block BLK can be freely selected. Each string unit SU is, for example, a set of NAND strings NS that are collectively selected in a write operation or a read operation.

The internal configuration of the string unit SU is described next. Each string unit SU includes a plurality of NAND strings NS. Each NAND string NS is a set of a memory cell transistors connected in series. The "NAND string NS" is also referred to as "memory string". The NAND strings NS in the string unit SU are connected to the bit lines BL0 to BLn (where n is an integer of 1 or more).

The following describes the internal configuration of the NAND string NS. Each NAND string NS includes memory cell transistors MC and select transistors ST1 and ST2. In the example illustrated in FIG. 3, each NAND string NS includes eight memory cell transistors MC0 to MC7.

Each memory cell transistor MC is a memory element for storing data in a nonvolatile manner. The memory cell transistor MC includes a control gate and a charge storage layer. The memory cell transistor MC may be a metal-oxide-nitride-oxide-silicon (MONOS) type or a floating gate (FG) type. The MONOS type uses an insulating layer for a charge storage layer. The FG type uses a conductor layer for a charge storage layer.

The select transistors ST1 and ST2 are switching elements. The select transistors ST1 and ST2 are used to select a particular string unit SU during various operations.

The current paths of the select transistor ST2, the memory cell transistor MC0 to MC7, and the select transistor ST1 in the NAND string NS are connected in series. The drain of the select transistor ST1 is connected to a bit line BL. The source of the select transistor ST2 is connected to a source line SL.

The control gates of the memory cell transistors MC0 to MC7 in the same block BLK are respectively connected to word lines WL0 to WL7. More specifically, the block BLK of the present example includes four string units SU0 to SU3. Each string unit SU includes a plurality of memory cell transistors MC0. The control gates of the memory cell transistors MC0 in the block BLK are connected to the same word line WL0. The same applies to memory cell transistors MC1 to MC7.

The gates of the plurality of select transistors ST1 in each string unit SU are commonly connected to the same select gate line SGD. More specifically, the gates of select transistors ST1 in the string unit SU0 are connected to a select gate line SGD0. The gates of the select transistors ST1 in the string unit SU1 are connected to a select gate line SGD1. The gates of the select transistors ST1 in the string unit SU2 are connected to a select gate line SGD2. The gates of the select transistors ST1 in the string unit SU3 are connected to a select gate line SGD3.

The gates of all the select transistors ST2 in the block BLK are connected to a select gate line SGS (common select gate line SGS).

The word lines WL0 to WL7, the select gate lines SGD0 to SGD3, and a select gate line SGS are respectively connected to the row decoder 102 for the plane PLN.

The bit lines BL are connected to one NAND string NS in each string unit SU of each block BLK. The same column address is allocated to the NAND strings NS connected to the same bit line BL. Each bit line BL is connected to the sense amplifier 103 for the plane PLN.

The source line SL is shared among, for example, a plurality of blocks BLK.

In one string unit SU, a set of a plurality of memory cell transistors MC connected to the same word line WL is referred to as a "cell unit CU" or the like. For example, when the memory cell transistor MC stores 1-bit data, the storage capacity of the cell unit CU is said to be "one page data". The cell unit CU can have a storage capacity of two or more page data based on the number of bits of data stored by each of memory cell transistors MC.

2. Data Management

Next, data management in the memory system 1 is described. In the nonvolatile memory 10 of the present embodiment, a management method of a block BLK is different for the user area (user data) and the system area (management data).

2.1 Method for Managing User Data

Figure 4:
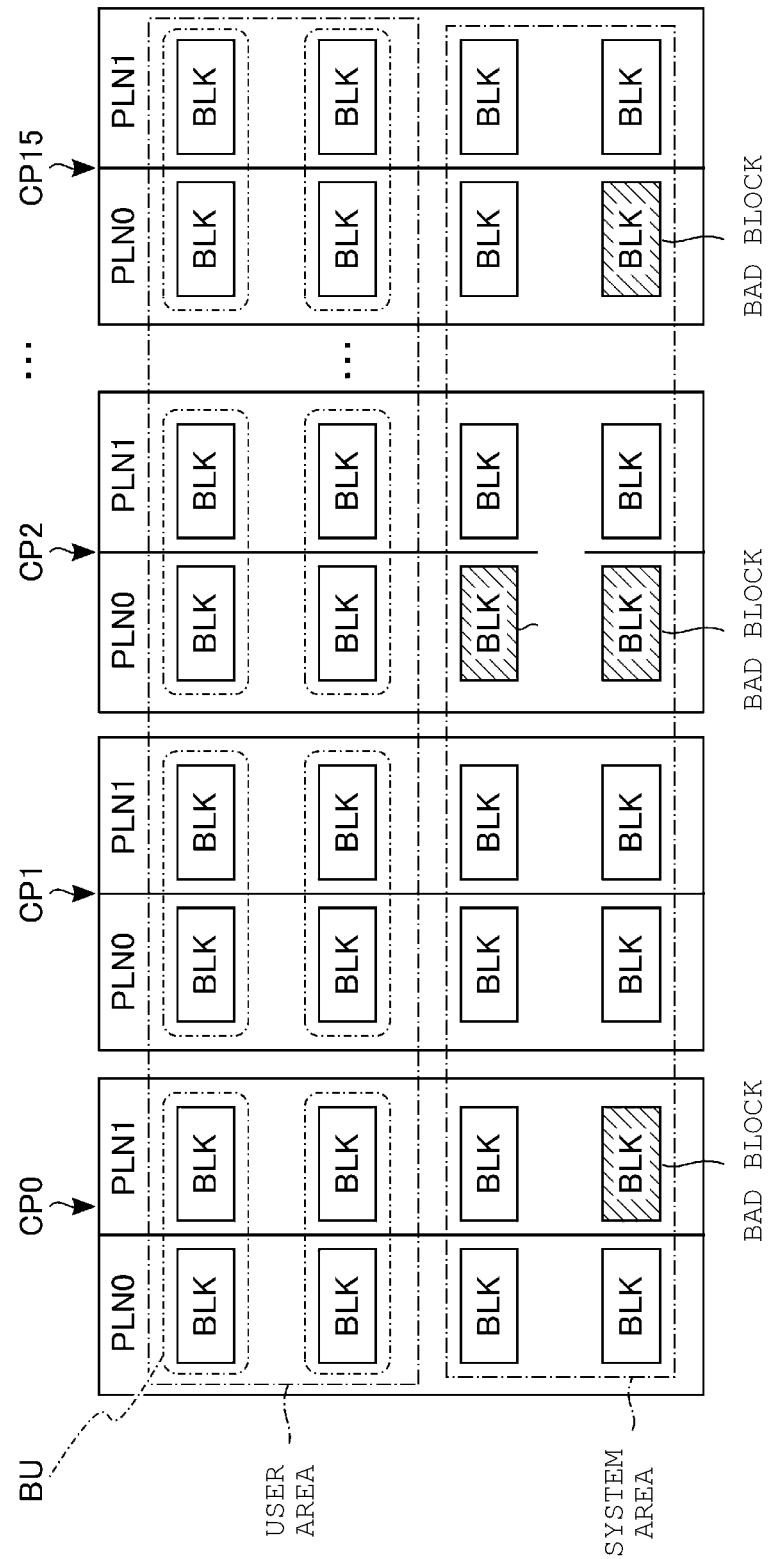
FIG. 4 is a diagram illustrating a configuration of blocks according to an embodiment.

First, an example of management of user data is described with reference to FIGS. 4 and 5. FIG. 4 illustrates an example of the configuration of the blocks BLK allocated to the user area and the system area. FIG. 5 is an example of a user data table.

The host device may specify a channel CH and a memory chip CP of a write destination in a write operation for user data. In this case, the maximum processing performance (processing speed) in the memory chip CP can be expected from the host device in the memory system 1. For example, when all the planes PLN in the memory chip CP execute write operations in parallel, the processing speed in the memory chip CP becomes its maximum. In the memory chip CP, the number of plane PLNs executing operations in parallel is referred to as "parallel degree" or the like. Therefore, the memory controller 20 allocates the block BLK of each plane PLN to the user area so that the processing speed can be maximized. In other words, in the user area, a block management unit is configured so that the parallel degree can be the maximum possible value.

As illustrated in FIG. 4, for example, when the memory chip CP includes two planes PLN0 and PLN1, write operations for the planes PLN0 and PLN1 are executed in parallel. In this way, the processing speed in the memory chip CP can be maximized. Thus, the memory controller 20 uses a block unit BU as a block management unit in the user area. The block unit BU is configured as a set (group) of blocks BLK selected one by one from all the planes PLN in the memory chip CP. Therefore, the number of blocks BLK in one block unit BU depends on the number of planes PLN in the memory chip CP. In an example of FIG. 4, the block unit BU includes one block BLK for the plane PLN0 and one block BLK for the plane PLN1. Also, for example, when the memory chip CP includes three planes PLN, one block unit BU would include three blocks BLK collected for each plane PLN. The memory controller 20 selects a valid block BLK when configuring the block units BU. A valid block BLK is a block BLK capable of normally executing write operations. The memory controller 20 does not select a defective block BLK for the block units BU. In this context, a defective block BLK is a disabled block BLK since write operations cannot be normally executed on the block BLK for whatever reason.

The memory controller 20 selects a block unit BU and executes the write operation for user data. Thus, parallel operations can be executed in the memory chip CP at the maximum parallel degree.

The number of block units BU in each memory chip CP may be freely selected and may be different from each other (chip to chip). In an example of FIG. 4, two block units BU are provided in each memory chip CP.

As illustrated in FIG. 5, the memory controller 20 allocates a management ID to each block unit BU in a user data table or the like. More specifically, the block BLK0_0 of the plane PLN0 and the block BLK0_1 of the plane PLN1 of the memory chip CP0 connected to the channel CH0 are allocated to a management ID_0001 in this example. Further, the block BLK1_0 of the plane PLN0 and the block BLK1_1 of the plane PLN1 of the memory chip CP0 connected to the channel CH0 are allocated to a management ID_0002. The block BLK0_0 of the plane PLN0 and the block BLK0_1 of the plane PLN1 of the memory chip CP1 connected to the channel CH0 are allocated to a management ID_0003. The block BLK1_0 of the plane PLN0 and the block BLK1_1 of the plane PLN1 of the memory chip CP1 connected to the channel CH0 are allocated to a management ID_0004. The block BLK1_0 of the plane PLN0 and the block BLK0_1 of the plane PLN1 of the memory chip CP2 connected to the channel CH0 are allocated to a management ID_0005. The block BLK2_0 of the plane PLN0 and the block BLK1_1 of the plane PLN1 of the memory chip CP2 connected to the channel CH0 are allocated to a management ID_0006. The block BLK0_0 of the plane PLN0 and the block BLK0_1 of the plane PLN1 of the memory chip CP15 connected to the channel CH3 are allocated to a management ID_0031. The block BLK1_0 of the plane PLN0 and the block BLK1_1 of the plane PLN1 of the memory chip CP15 connected to the channel CH3 are allocated to a management ID_0032. The same applies to other management IDs.

The memory controller 20 can update the user data table when the number of defective blocks BLK increases, for example. More specifically, when a valid block BLK within the block unit BU becomes a defective block BLK, the memory controller 20 moves the block unit BU including the defective block BLK from the user area to the system area. At this time, the memory controller 20 updates the user data table and the table for management data to reflect the move/change.

For example, when receiving a write request with the specified channel CH and memory chip CP from the host device, the memory controller 20 selects a block unit BU (management ID) in the specified memory chip CP. The memory controller 20 executes a write operation to a selected block unit BU. More specifically, the memory controller 20 receives a write request with the specified memory chip CP0 from the host device. In this case, the memory controller 20 selects any block unit BU of management ID_0001 and 0002 corresponding to the memory chip CP0. The memory controller 20 executes a write operation on the selected block unit BU. The memory controller 20 selects any block unit BU (management ID) of one of the memory chips CP when receiving a write request with no specified memory chip CP from the host device. The memory controller 20 executes a write operation on the selected block unit BU.

The memory controller 20 can execute write operations on a plurality of memory chips CP of a plurality of channels CH or a plurality of memory chips CP of one channel CH in parallel. In this case, the memory controller 20 can simultaneously select a plurality of block units BU (management ID). Thus, the memory controller 20 obtains the maximum parallel degree in the write operations using the plurality of memory chips CP.

2.2 Method for Managing Management Data

An example of management of management data is described with reference to FIGS. 4 and 6. FIG. 6 is a management data table in the system area.

In general, write operations for management data have little influence on the processing speed apparent to the host device. That is, a write operation for the management data is not restricted by the block management unit (write unit) by the host device. Therefore, the block units BU are not required to be established for the system area. For this reason, in the present embodiment, the memory controller 20 executes the management by blocks BLK in the system area, which is different from the user area which uses block units BU.

When a defective block BLK is generated in the memory chip CP, as illustrated in FIG. 4, the number of valid blocks BLK of the plane PLN0 and the number of valid blocks BLK of the plane PLN1 in the memory chip CP no longer coincide. As a result, in the plane PLN having a large number of valid blocks BLK, a valid block BLK which cannot be used in a block unit BU can be left unused. A valid block BLK which cannot be used for a block unit BU is referred to as an "unused valid block BLK" in this context.

In the present embodiment, the memory controller 20 preferentially allocates any unused valid block (BLK) and any defective block (BLK) to the system area. In the present example, two blocks BLK from each plane PLN of each memory chip CP are allocated to the system area. Thus, in this example, for the memory chip CP0, one defective block BLK of the plane PLN1 and one unused valid block BLK of the plane PLN0 are allocated to the system area. For the memory chip CP0, one valid block BLK of each plane PLN is also allocated. In this example, memory chip CP1 has no defective block BLK. Thus, two valid blocks BLK of each plane PLN of memory chip CP1 are allocated to the system area. For the memory chip CP2, the plane PLN0 has two defective blocks BLK. Thus, two defective blocks BLK of the plane PLN0 and two unused valid blocks BLK of the plane PLN1 are allocated to the system area. For the memory chip CP15, the plane PLN0 has one defective block BLK. Thus, one defective block BLK of the plane PLN0 and one unused valid block BLK of the plane PLN1 are allocated to the system area. In the memory chip CP15, one valid block BLK of each plane PLN is also allocated.

In an example of FIG. 4, the memory controller 20 preferentially allocates a defective block BLK to the system area. However, the defective block BLK is a disabled (non-functional) block BLK. Therefore, the defective block BLK may be considered excluded from the data area and the system area.

As illustrated in FIG. 6, the memory controller 20 allocates a management ID to each block BLK in a table for management data (management data table), for example. More specifically, in this example, the block BLK2_0 of the plane PLN0 of the memory chip CP0 connected to the channel CH0 is allocated to management ID_1001. The block BLK2_1 of the plane PLN1 of the memory chip CP0 connected to the channel CH0 is allocated to management ID_1002. The block BLK3_0 of the plane PLN0 of the memory chip CP0 connected to the channel CH0 is allocated to management ID_1003. The defective block BLK3_1 of the plane PLN1 of the memory chip CP0 connected to the channel CH0 is allocated to management ID_1004. The block BLK2_0 of the plane PLN0 of the memory chip CP1 connected to the channel CH0 is allocated to management ID_1005. The block BLK2_1 of the plane PLN1 of the memory chip CP1 connected to the channel CH0 is allocated to management ID_1006. The block BLK3_0 of the plane PLN0 of the memory chip CP1 connected to the channel CH0 is allocated to management ID_1007. The block BLK3_1 of the plane PLN1 of the memory chip CP1 connected to the channel CH0 is allocated to management ID_1008. The defective block BLK0_0 of the plane PLN0 of the memory chip CP2 connected to the channel CH0 is allocated to management ID_1009. The block BLK2_1 of the plane PLN1 of a memory chip CP2 connected to the channel CH0 is allocated to management ID_1010. The defective block BLK3_0 of the plane PLN0 of the memory chip CP2 connected to the channel CH0 is allocated to management ID_1011. The block BLK3_1 of the plane PLN1 of a memory chip CP2 connected to the channel CH0 is allocated to management ID_1012. The block BLK2_0 of the plane PLN0 of the memory chip CP15 connected to the channel CH3 is allocated to management ID_1061. The block BLK2_1 of the plane PLN1 of the memory chip CP15 connected to the channel CH3 is allocated to management ID_1062. The defective block BLK3_0 of the plane PLN0 of the memory chip CP15 connected to the channel CH3 is allocated to management ID_1063. The block BLK3_1 of the plane PLN1 of the memory chip CP15 connected to the channel CH3 is allocated to management ID_1064.

The memory controller 20 can update the management data table when the number of defective blocks BLK is increased.

The memory controller 20 can manage the entire system area as a parallel unit for write operations. In other words, the memory controller 20 can select a plurality of blocks BLK (by management ID) in the system area and execute write operations when the management data is written. Thus, the memory controller 20 can execute write operations at an increased parallel degree. For example, the memory controller 20 selects the block BLK2_0 of the plane PLN0 of the memory chip CP0 connected to the channel CH0 with the management ID_1001 and the block BLK2_0 of the plane PLN0 of the memory chip CP15 connected to the channel CH3 with the management ID_1061. The memory controller 20 may execute write operations in parallel to these two selected blocks BLK. Processing speed can be improved by selecting a plurality of memory chips CP and increasing the parallel degree of write operations.

3. Write Operation Flow

Figure 7:
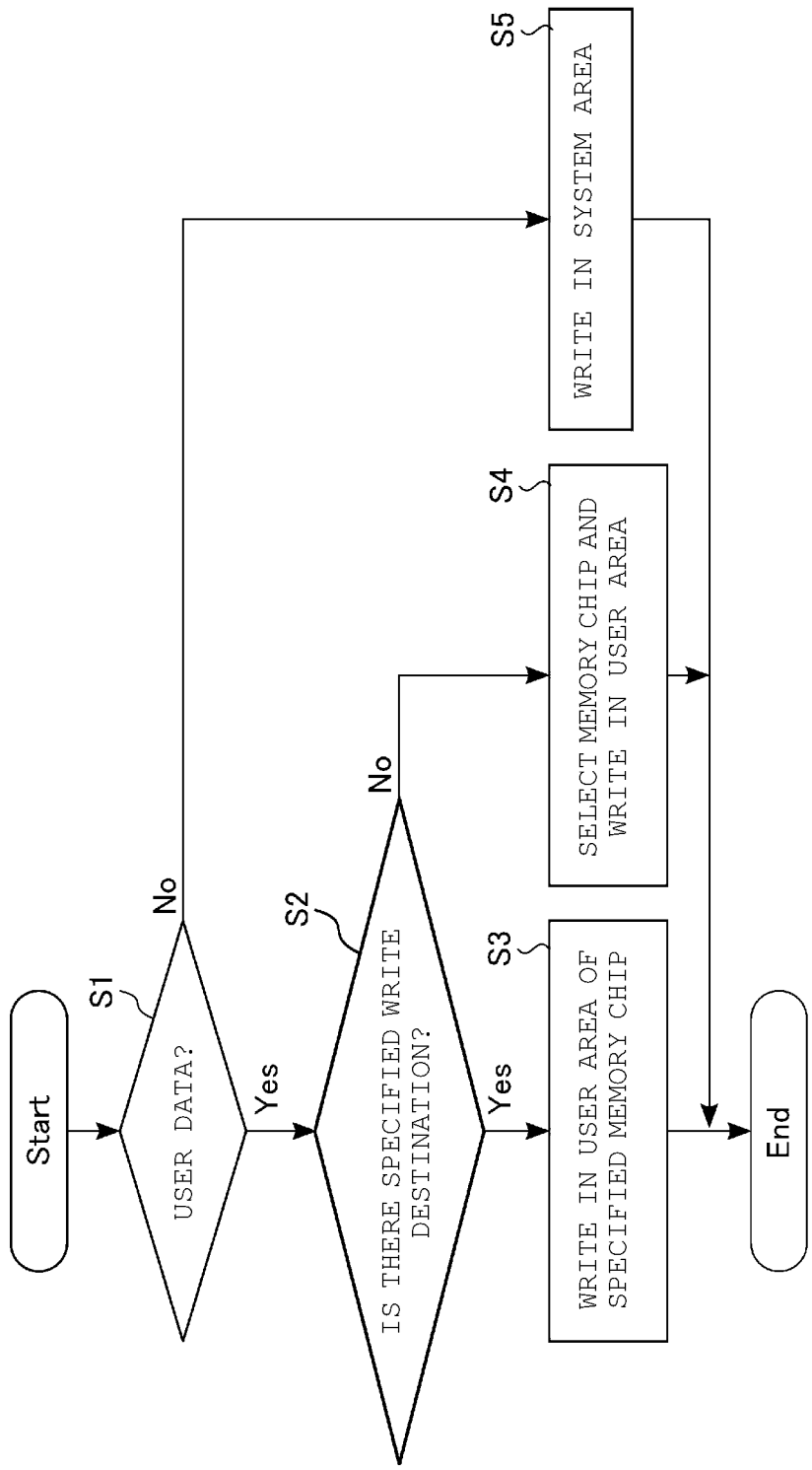
FIG. 7 is a flowchart of a write operation according to an embodiment.

Next, an example of a write operation flow is described with reference to FIG. 7. FIG. 7 is a flowchart of a write operation.

As illustrated in FIG. 7, the memory controller 20 first confirms whether write data is user data or not (S1).

When the write data is user data (S1, Yes), the memory controller 20 next confirms whether a channel CH and memory chip CP of a write destination have been specified from the host device (S2).

When a write destination is specified (S2, Yes), the memory controller 20 selects a block unit BU of the specified memory chip CP. Then, the memory controller 20 executes the write operation of the specified memory chip CP to the user area (S3). More specifically, the memory controller 20 selects a block unit BU in the specified memory chip CP based on the user data table.

Next, the memory controller 20 determines the address of the cell unit CU in each block BLK of the selected block unit BU. The memory controller 20 transmits a write command, an address, and user data to the selected memory chip CP. For example, when the memory chip CP includes the planes PLN0 and PLN1, write operations are executed in parallel to the planes PLN0 and PLN1. Thus, the memory controller 20 transmits user data for at least two pages to the memory chip CP. Therefore, the memory controller 20 executes write operations only after the user data for at least two pages are collected. In the selected memory chip CP, the write operations of each plane PLN are executed in parallel based on the write command and the address. Thus, the maximum processing speed in the memory chip CP is obtained.

When there is no specified write destination (S2, No), the memory controller 20 selects a channel CH, a memory chip CP, and a block unit BU based on the user data table. The memory controller 20 writes the user data in the user area of the selected memory chip CP (S4). The details of the write operations are similar to S3.

When the write data is not user data (S1, No), that is, when the write data is management data, the memory controller 20 writes the management data in the system area of one of the memory chips CP (S5). More specifically, the memory controller 20 selects at least one channel CH, a memory chip CP, a plane PLN, and a block BLK based on the management data table. The memory controller 20 determines the address of the cell unit CU in the selected block BLK. The memory controller 20 transmits a write command, an address, and management data to the selected memory chip CP. In the selected plane PLN, write operations are executed based on the write command and the address.

4. Effects According to Present Embodiment

With the configuration according to the present embodiment, processing capability in the memory system can be improved.

For example, when the user area of the memory chip CP is managed in blocks, the number of valid blocks BLK in the user area may vary with the planes PLN due to the presence of defective blocks BLK. In a plane PLN having a small number of valid blocks BLK, the valid blocks BLK usable for writing user data are used up earlier than in the other planes PLN. In this case, it may eventually not be possible to select a valid block BLK from all the planes PLN. Therefore, write operations cannot be executed in parallel using all the planes PLN in the memory chip CP. That is, write operations cannot be performed at maximum parallel degree. Therefore, the processing speed of the writing operation is decreased.

In contrast, with the configuration according to the present embodiment, the user area of the memory chip CP can instead be managed in block unit BU units. Each block unit BU includes a valid block BLK of each plane PLN in the memory chip CP. By selecting a block unit BU, the write operations of the user data in the memory chip CP can be executed at the maximum parallel degree. Thus, a decrease in the processing speed of write operations can be prevented.

With the configuration according to the present embodiment, the valid blocks BLK left unused in the configuration of the block units BU due to the presence of defective blocks BLK can instead be preferentially allocated to the system area. Thus, the unused valid blocks BLK can be more effectively utilized. Thus, the influence of a decrease in the memory capacity due to an increase in defective blocks BLK can be reduced.

Furthermore, with the configuration according to the present embodiment, different block management methods can be applied to the user area and the system area. In some examples, the system area can also be managed in block units rather than blocks (a per block basis). In some examples, the entire system area can be managed as a parallel unit of write operations. Thus, a plurality of memory chips CP can be selected as the entire system area, and the parallel degree of write operations can be increased. Thus, even when unused valid blocks BLK are used, a decrease in the write processing speed can be prevented.

The embodiments are not limited to the specific examples described above and details can be varied.

In an embodiment, a method for managing data is described in an example using a write operation, but the same can also be applied to a read operation.

Further, the "connection" in the embodiment includes a state in which things are indirectly connected to each other via another thing, for example, a transistor or a resistor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
    a first memory chip that includes:
        a first plane including a first memory cell array having a first block and a second block, each including a plurality of memory cells, and
        a second plane including a second memory cell array having a third block and a fourth block, each including a plurality of memory cells;
    a second memory chip that includes:
        a third plane including a third memory cell array having a fifth block and a sixth block, each including the plurality of memory cells, and
        a fourth plane including a fourth memory cell array having a seventh block and an eighth block, each including the plurality of memory cells; and
    a memory controller for controlling the first memory chip and the second memory chip, the memory controller configured to:
        set the first block and the third block to be a first block unit in a first storage area for user data,
        set the fifth block and the seventh block to be a second block unit in the first storage area,
        allocate the second block, the fourth block, the sixth block, and the eighth block to a second storage area for system management data, and
        manage user data operations for accessing the first storage area in block units.

2. The memory system according to claim 1, wherein the memory controller is configured to preferentially allocate any defective block to the second storage area.

3. The memory system according to claim 1, wherein the memory controller is configured to execute a write operation for user data to the first block and a write operation for user data to the third block in parallel.

4. The memory system according to claim 1, wherein the memory controller is configured to select at least one of the second block, the fourth block, the sixth block, and the eighth block when executing a write operation for system management data.

5. The memory system according to claim 1, wherein
    the first plane further includes a first row decoder and a first sense amplifier connected to the first memory cell array, and
    the second plane further includes a second row decoder and a second sense amplifier connected to the second memory cell array.

6. The memory system according to claim 1, wherein the memory controller is configured to allocate at least two blocks from each plane of each memory chip to the second storage area.

7. The memory system according to claim 6, wherein the memory controller is further configured to preferentially allocate defective blocks as the at least two blocks from each plane of each memory chip.

8. The memory system according to claim 1, wherein the memory controller is configured to manage the second storage area on a block basis.

9. The memory system according to claim 1, wherein the memory controller is configured to manage the second storage area on a block unit basis.

10. The memory system according to claim 1, wherein the memory controller is configured to manage the second storage area as single parallel write unit.

11. The memory system according to claim 1, wherein the first and second memory chips are NAND memory chips.

12. A memory controller for controlling a plurality of memory chips, each memory chip with at least two planes, each plane including a plurality of blocks, each block including a plurality of memory cells, the memory controller comprising:
    a memory chip interface for connecting to a plurality of memory chips via a plurality of channels;
    a host interface for receiving data and commands from a host device; and
    a processor configured to:
        allocate at least two blocks in each plane of each memory chip to a system area for storage of system management data not accessible by the host device,
        establish block units for each memory chip, each block unit including a block from each plane of the memory chip,
        allocate each block unit to a user area for storage of user data accessible by the host device, and
        manage user data operations in block units for accessing the user data in the user area according to commands from the host device.

13. The memory controller according to claim 12, wherein the processor is configured to preferentially allocate defective blocks to the system area.

14. The memory controller according to claim 12, wherein write operations to each block of a block unit are performed in parallel.

15. The memory system according to claim 12, wherein the processor is configured to manage the system area on a block basis.

16. A data management method for a memory system with a plurality of memory chips, each with at least two planes, each plane including a plurality of blocks, each block including a plurality of memory cells, the method comprising:

allocating at least two blocks in each plane of each memory chip to a system area for storage of system management data not accessible by a host device;

establishing block units for each memory chip, each block unit including a block from each plane of the memory chip;

allocating each block unit to a user area for storage of user data accessible by the host device; and managing user data operations in block units for accessing the user area according to commands from the host device.

17. The data management method according to claim 16, further comprising:

preferentially allocating defective blocks to the system area.

18. The data management method according to claim 16, further comprising:

performing write operations to each block of a block unit in parallel.

19. The data management method according to claim 16, further comprising:

managing the system area on a block basis.

20. The data management method according to claim 16, wherein each memory chip is a NAND memory chip.

\* \* \* \* \*